United States Patent [19]
Han

[11] Patent Number: 6,103,603
[45] Date of Patent: Aug. 15, 2000

[54] METHOD OF FABRICATING GATE ELECTRODES OF TWIN-WELL CMOS DEVICE

[75] Inventor: Suk-Bin Han, Chungcheongbuk-do, Rep. of Korea

[73] Assignee: LG Semicon Co., Ltd., Chungcheongbuk-Do, Rep. of Korea

[21] Appl. No.: 09/065,487

[22] Filed: Apr. 24, 1998

[30] Foreign Application Priority Data

Sep. 29, 1997 [KR] Rep. of Korea ................. 97/49796

[51] Int. Cl.[7] .................................................. H02L 21/00
[52] U.S. Cl. ..................... 438/532; 438/711; 438/712; 438/714; 438/734; 438/735; 438/742
[58] Field of Search ................................. 438/532, 706, 438/711, 734, 735, 742, 712, 714

[56] References Cited

U.S. PATENT DOCUMENTS

| 4,468,285 | 8/1984 | Bayman et al. | 438/714 |
|---|---|---|---|
| 5,013,398 | 5/1991 | Long et al. | 438/714 |
| 5,242,536 | 9/1993 | Schoenborn | 438/734 |
| 5,665,203 | 9/1997 | Lee et al. | 438/714 |
| 5,854,136 | 12/1998 | Huang et al. | 438/714 |
| 5,877,090 | 3/1999 | Padmapani et al. | 438/714 |

OTHER PUBLICATIONS

Journal of Vacuum Science & Technology B, "Microelectronics and Nanometer Structures Processing, Measurement, and Phenomena," vol. 13. No. 2. Mar./Apr. 1995, pp. 214–226.

Primary Examiner—Donald L. Monin, Jr.
Assistant Examiner—Micheal Dietrich

[57] ABSTRACT

A multi-step dry-etching method that sequentially employs plasma etching and reactive ion etching process steps to form the pairs of adjacent, doped polysilicon gate electrodes of a twin-well CMOS device. The initial dry-etching process step uses to best advantage the speed of plasma etching to rapidly form pairs of adjacent p- and n-type gate-precursor features with substantially vertical sidewalls from the upper 50–80% of a doped polysilicon layer which lies on an insulating film. The gate-precursor features and, subsequently, the gate electrodes are formed from pairs of adjacent p- and n-type regions within the doped polysilicon layer which lie over pairs of adjacent n- and p-wells (the twin wells of the CMOS device), respectively, within a substrate. The subsequent dry-etching process step uses reactive ion etching to complete the formation of the pairs of adjacent, doped polysilicon gate electrodes from the remaining 50–20% of the etched, doped polysilicon layer without over-etching the insulating film.

18 Claims, 7 Drawing Sheets

METHOD OF FABRICATING GATE ELECTRODES OF TWIN-WELL CMOS DEVICE

BACKGROUND OF THE INVENTION

1. Field of the Invention

The present invention relates to a method of fabricating a complementary metal oxide semiconductor (CMOS) device and, more particularly, to a method of fabricating the doped polysilicon gate electrodes of a twin-well CMOS device.

2. Discussion of the Related Art

Process steps of a conventional method of fabricating the doped polysilicon gate electrodes of a metal oxide semiconductor (MOS) device are described immediately below with reference to the idealized cross-sectional views of FIGS. 1A–1C.

Figure 1A:
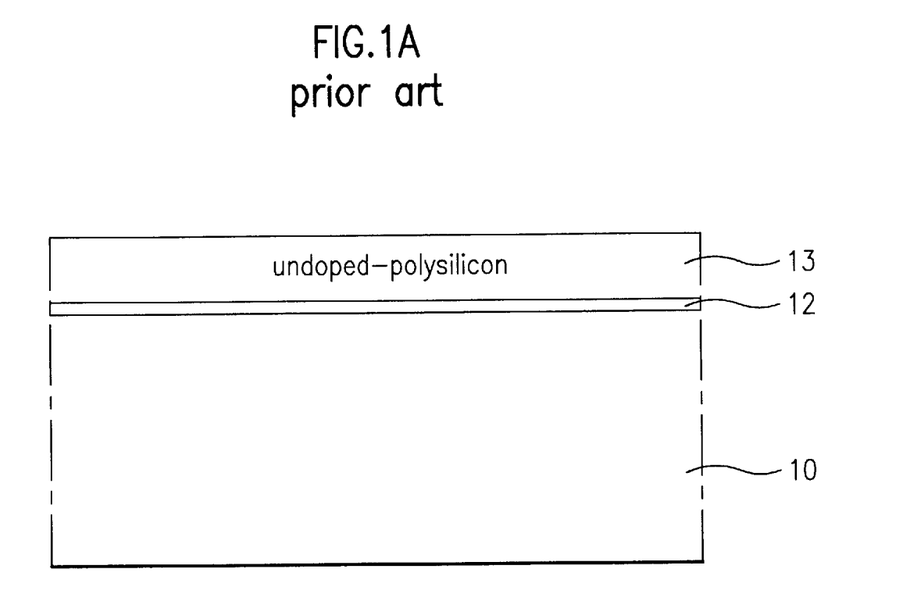
FIGS. 1A–1C are cross-sectional views showing conventional process steps which precede formation of the doped polysilicon gate electrodes of an MOS device.

As shown in FIG. 1A, a thin thermal oxide film 12 is grown on a lightly-doped silicon substrate 10 of a first conductivity type and an undoped polysilicon layer 13 is deposited onto the oxide film 12.

Figure 1B:
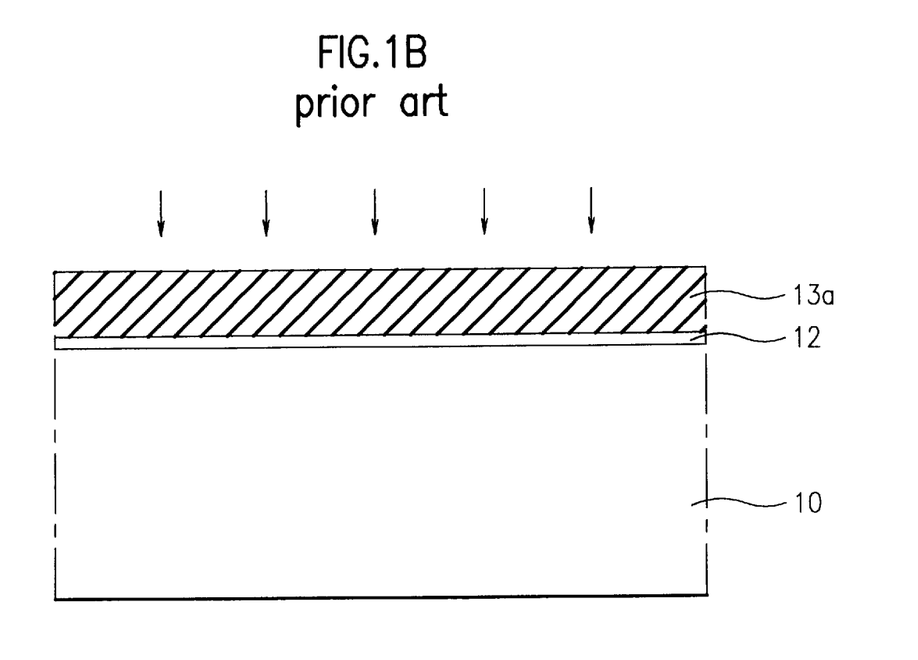

As shown in FIG. 1B, a $10^{13}$–$10^{15}$ ions/cm$^2$ dose of 10–15 keV ions of a second conductivity type is implanted into the undoped polysilicon layer 13 in order to form a doped polysilicon layer 13a of the second conductivity type. After the surface of the doped polysilicon layer has been cleansed, it is annealed at a temperature of 800° C. for 30–60 minutes.

Figure 1C:
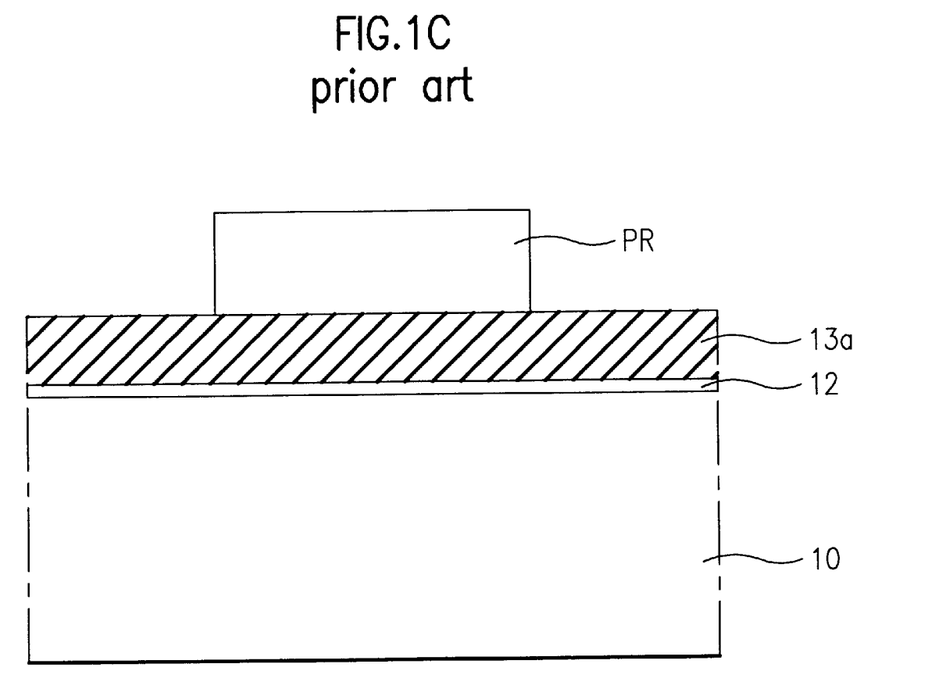

As shown in FIG. 1C, a photoresist coating is spun onto the doped polysilicon layer 13a and patterned by using conventional exposure and development process steps to form a photoresist pattern PR. Masked by the photoresist pattern PR, the doped polysilicon layer 13a is then etched to form regularly-spaced, doped polysilicon gate electrode strips of the second conductivity type (over the lightly-doped silicon substrate 10 of the first conductivity type). Although it is possible, in the course of fabricating an MOS device, to form doped polysilicon gate electrodes of the first conductivity type over the lightly-doped, single-crystal silicon substrate of the first conductivity type, adjustment of the threshold voltage of the device would prove difficult with these dopings.

Dry-etching processes that employ either plasma etching or reactive ion etching have generally replaced wet-etching processes as the means of pattern transfer in the fabrication of the current generation of VLSI circuits because wet-etching processes are isotropic. If the thickness of the film being etched is comparable to the minimum pattern dimension, undercutting due to isotropic etching becomes intolerable. Since many films used in VLSI fabrication are now 2000–5000 Å (0.2–0.5 μm) thick, reproducible and controllable transfer of patterns in the 0.2–0.5 μm range becomes difficult, if not impossible, by means of wet etching.

Even dry-etching processes, however, are not without their shortcomings with respect to the fabrication of the current generation of self-aligned, short-channel devices on thin insulating films. Although all dry-etching processes offer at least the possibility of anisotropy, some dry-etching processes are more anisotropic than others. Moreover, the selectivities and speeds of dry-etching processes differ greatly.

Figure 2A:
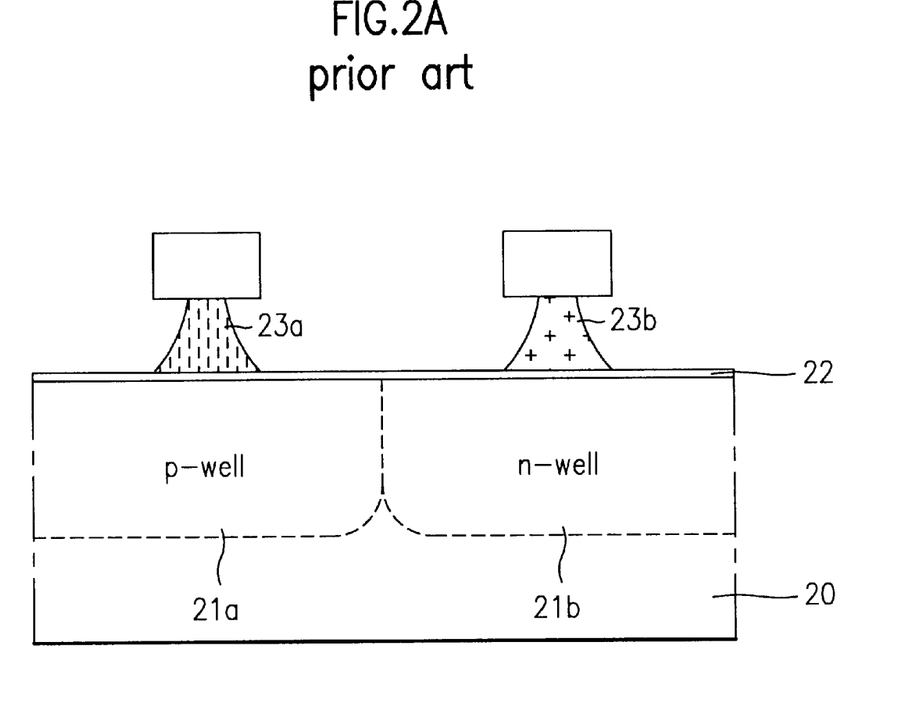
FIGS. 2A–2B are cross-sectional views of the doped polysilicon gate electrodes of a twin-well CMOS device formed by using of conventional reactive ion etching systems.
Figure 2B:
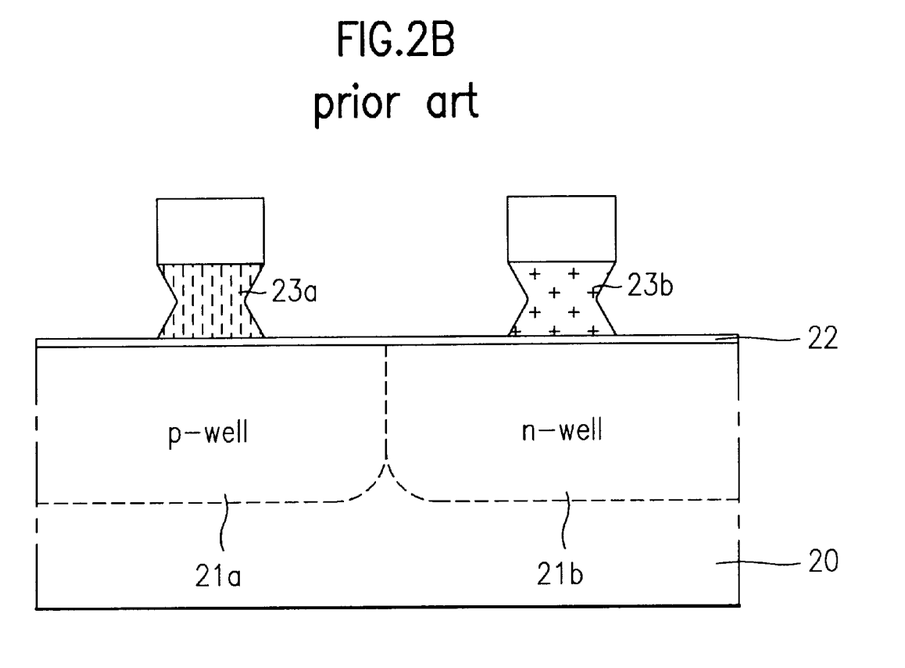
Figure 2C:
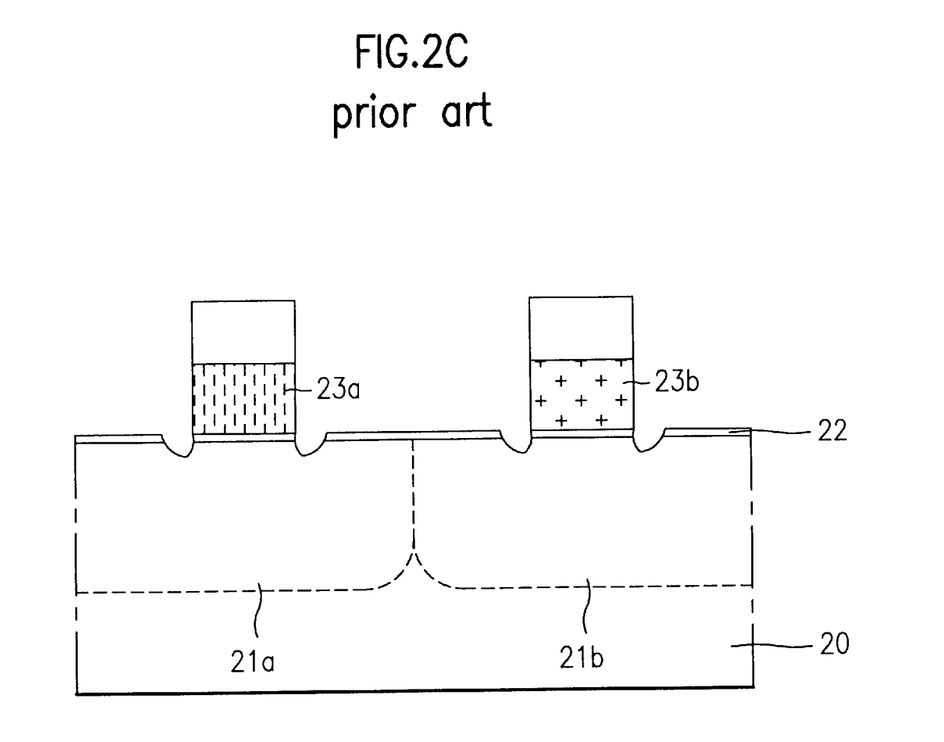
FIG. 2C is a cross-sectional view of the doped polysilicon gate electrodes of a twin-well CMOS device formed by using a conventional plasma etching system.

As shown in FIGS. 2A–2C, an n-type polysilicon gate electrode 23a lies on an insulating film 22 over a p-well 21a within a semiconductor substrate 20, and a p-type polysilicon gate electrode 23b, which is adjacent to the n-type gate electrode 23a, lies over an n-well 21b, which is adjacent to the p-well 21a. (Adjacent structures are structures in close proximity to each other. The adjective adjacent may or may not imply contact, but always implies absence of anything of like kind between the structures.) Since reactive ion etching is based on a combination of physical and chemical mechanisms, reactive ion etching processes are generally slower than plasma etching processes. Moreover, where a reactive ion etching process has been used to form the gate electrodes of a CMOS device, the sidewalls of the gate electrodes are typically not vertical, but rather either undercut the photoresist pattern, as shown in FIG. 2A, or are concave-in, as shown in FIG. 2B.

Since plasma etching is based on only a chemical mechanism, plasma etching processes are typically faster than reactive ion etching processes by several orders of magnitude. Due to the speed of plasma etching processes, forming polysilicon gate electrodes in a plasma etching system is necessarily a two-step process consisting, for example, of an initial, rapid main-etch with Cl$_2$ gas at a high etch gas feed rate, followed by a slower over-etch with either Cl$_2$ gas or HBr gas at a slower etch gas feed rate. Where, as shown in FIG. 2C, an anisotropic plasma etching process has used to form the gate electrodes of a CMOS device, the thin gate insulating film and often the substrate to either side of each of the gate electrodes typically sustain etch damage, although the sidewalls of the gate electrodes are typically vertical.

SUMMARY OF THE INVENTION

An object of the invention is to provide a multi-step, dry-etching method that sequentially employs plasma etching and reactive ion etching process steps to fabricate the pairs of adjacent, doped polysilicon gate electrodes of a twin-well CMOS device. The initial dry-etching process step uses to advantage the speed of plasma etching to rapidly form pairs of adjacent p- and n-type gate-precursor features with substantially vertical sidewalls from the upper 50-80% of a doped polysilicon layer which lies on an insulating film. The gate-precursor features and, subsequently, the gate electrodes are formed from pairs of adjacent p- and n-type regions within the doped polysilicon layer which lie over pairs of adjacent n- and p-wells (the twin wells of the CMOS device), respectively, within the substrate. The subsequent dry-etching process step uses reactive ion etching to complete the formation of the pairs of adjacent p- and n-type polysilicon gate electrodes from the lower 50–20% of the etched, doped polysilicon layer without over-etching the insulating film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

None of the figures briefly described below are drawn to scale. As is common in the art of integrated circuit representation, the thicknesses and lateral dimensions of the various layers shown in the figures were chosen only to enhance the legibility of the figures.

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Process steps of an embodiment of the method of the present invention of fabricating pairs of adjacent doped polysilicon gate electrodes of a twin-well CMOS device are described immediately below with reference to the cross-sectional views of FIGS. 3A–3F.

Figure 3A:
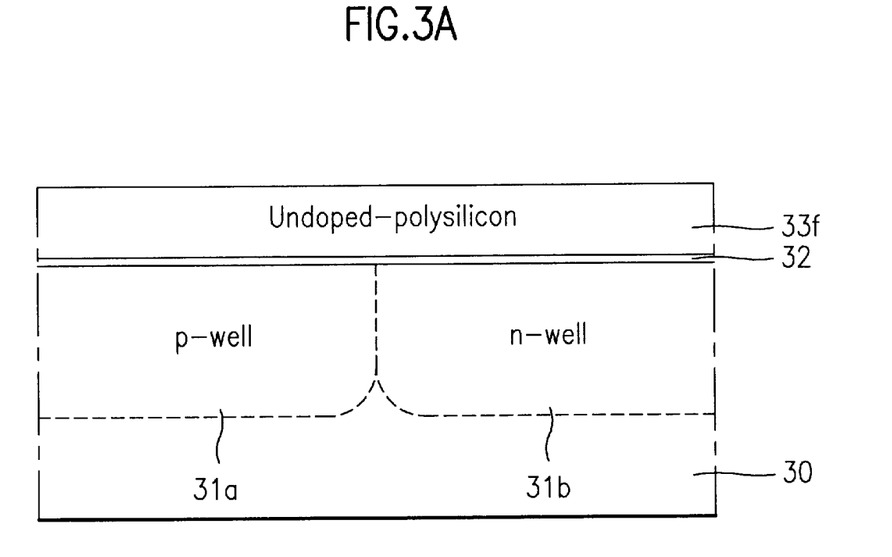
FIGS. 3A–3F are idealized cross-sectional views showing process steps of a method for forming the doped polysilicon gate electrodes of a twin-well CMOS device according to an embodiment of the present invention.

As shown in FIG. 3A, a thin insulating film 32 (typically a thermal oxide film) is formed on the upper surface of a lightly-doped semiconductor substrate 30 within which pairs of adjacent p-wells 31a and n-wells 31b have been formed. (The substrate may be either a lightly-doped wafer or a thin, lightly-doped epitaxial layer on a heavily-doped wafer. Each of the well dopants is implanted into the lightly-doped surface region and then driven to the desired depth below the surface. The twin wells would be the first features formed on the substrate unless either trench isolation or selective epitaxial growth isolation were employed to restrict the lateral diffusion of the dopants in each of the wells.) An undoped polysilicon layer 33f of thickness 2000–2500 Å is deposited onto the insulating film 32. To facilitate the description of the invention, pairs of adjacent first and second regions of the undoped polysilicon layer 33f are defined as those pairs of adjacent regions of the undoped polysilicon layer 33f that lie over the pairs of adjacent n- and p-wells 31b and 31a, respectively, of the substrate.

As briefly noted above, it would be difficult to adjust the threshold voltage of the PMOS transistors of a CMOS device if the polysilicon gate electrodes of both the NMOS and PMOS transistors of the device are doped with n-type dopants, just as it would be difficult to adjust the threshold voltage of the NMOS transistors if the polysilicon gate electrodes of both the NMOS and PMOS transistors are doped with p-type dopants. In the method of the present invention, p-type dopants are thus used to dope the polysilicon gate electrodes of the PMOS transistors and n-type dopants are used to dope the polysilicon gate electrodes of the NMOS transistors.

Figure 3B:
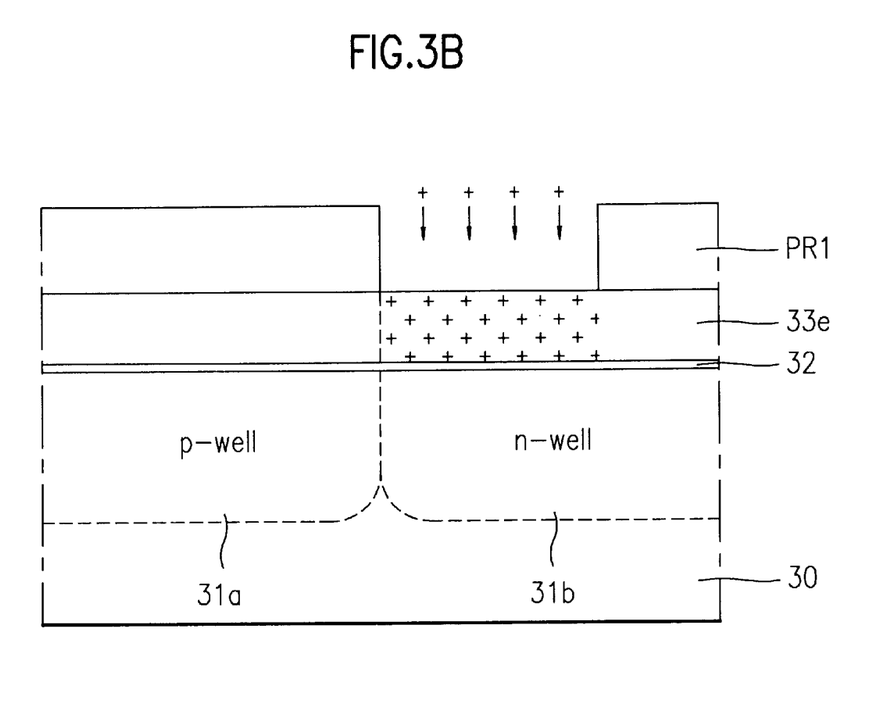

A photoresist coating is spun onto the undoped polysilicon layer 33f and patterned by means of conventional exposure and development process steps in order to form a first photoresist pattern PR1 that masks all of the undoped polysilicon layer 33f except save for those regions that lie over the n-wells of the substrate (i.e., the first regions). As shown in FIG. 3B, a $10^{13}$–$10^{15}$/cm$^2$ dose of 10–15 keV p-type dopants (e.g., B$^+$ or BF$_2^+$) is implanted into the undoped polysilicon layer 33f, masked by the first photoresist pattern PR1, in order to form a doped polysilicon layer 33e that includes p-type first regions 35a which lie over the n-wells 31b of the substrate 30 (and from which the p-type gate electrodes 33b will be formed).

Figure 3C:
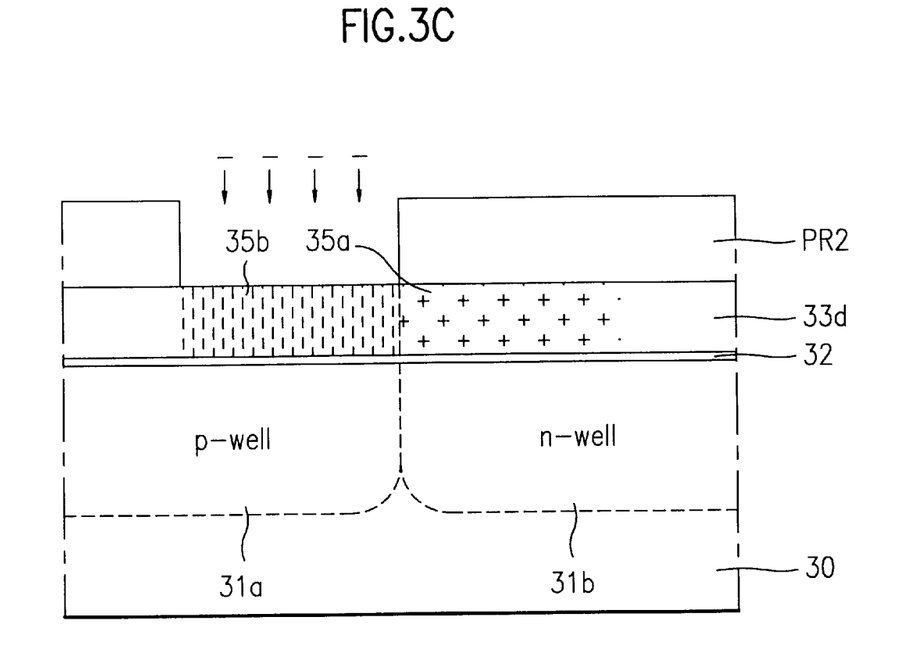

After the first photoresist pattern PR1 has been stripped, a second photoresist coating is spun onto the polysilicon layer 33 and patterned by means of conventional exposure and development process steps in order to form a second photoresist pattern PR2 that masks all of the doped polysilicon layer 33e except for those regions that lie over the p-wells 31a of the substrate (i.e., the second regions). As shown in FIG. 3C, a $10^{13}$–$10^{15}$/cm$^2$ dose of 10–15 keV n-type dopants (e.g., P$^-$ or As$^-$) is implanted into the doped polysilicon layer 33e, masked by the second photoresist pattern PR2, in order to form a doped polysilicon layer 33d that includes both the p-type first regions which lie over the n-wells 31b (and from which the p-type gate electrodes 33b will be formed) and n-type second regions 35b which lie over the p-wells 31a (and from which the n-type gate electrodes 33a will be formed). After the second photoresist pattern PR2 has been stripped and the surface cleansed, the substrate is annealed at a temperature of 800° C. for 30–60 minutes.

Figure 3D:
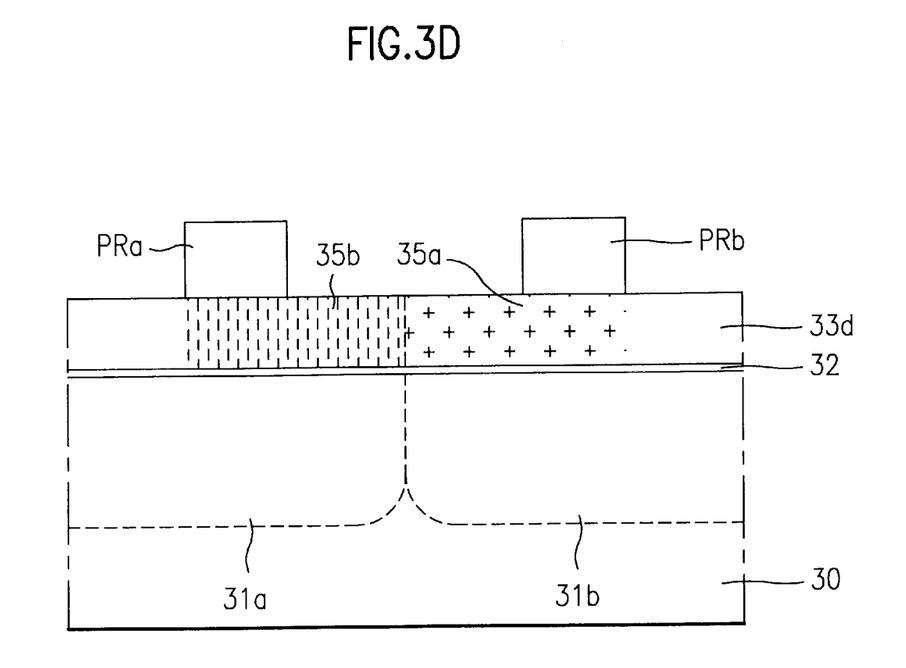

As shown in FIG. 3D, a photoresist coating is spun onto the doped polysilicon layer 33d and patterned by means of conventional exposure and development process steps to form photoresist patterns PRa and PRb that lie over the n-type second regions 35b and p-type first regions 35a, respectively, of the doped polysilicon layer 33d.

An anisotropic plasma etching system is employed to etch the upper 50–80% of the doped polysilicon layer 33d in order to take advantage of the speed of plasma etching. A reactive ion etching (or, more accurately, an ion-assisted etching) system is subsequently used to etch the remaining 50–20% of the doped polysilicon layer 33d, primarily because reactive ion etching does not approach the etch end point, the thin insulating film 32, as quickly as plasma etching would. Moreover, the speed at which the etch end point is approached by means of reactive ion etching can be readily controlled by changing the mixture of etch gases and/or adjusting the feed rates of the etch gases in the reactive ion etching system.

Ideally, one may prefer to quickly form gate electrodes with vertical sidewalls and avoid etching the insulating film 22. More realistically, one may wish to quickly form gate electrodes with substantially vertical sidewalls, to etch the insulating film 32 as little as possible, and to avoid etching the substrate 30. Sequentially employing a plasma etching process step followed by a reactive ion etching process step enables one to more completely achieve the goals than would employing either a plasma etching process step or a reactive ion etching process step alone.

Figure 3E:
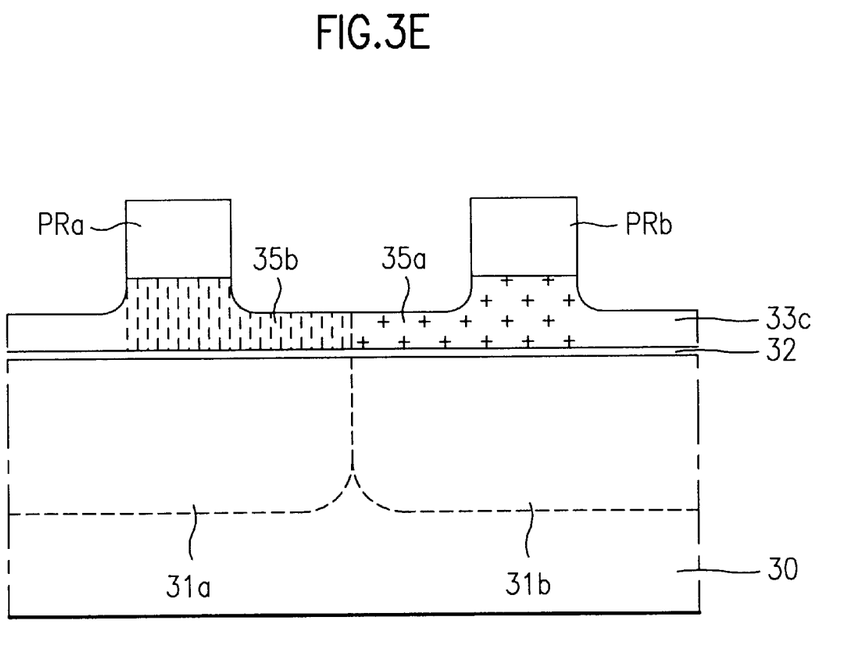

Masked by the photoresist patterns PRa and PRb, the upper 50–80% of the doped polysilicon layer 33d is selectively and anisotropically dry-etched in an anisotropic plasma etching system in order to form an etched, doped polysilicon layer 33c that includes pairs of adjacent first p-type and second n-type gate-precursor features which have substantially vertical sidewalls, as shown in FIG. 3E. The plasma etch is conducted at 4–5 mTorr pressure in a mixture of Cl$_2$ gas and HBr gas at 1000 Watts source power and 5–150 Watts bias power. The Cl$_2$ and HBr gas feed rates are adjusted so that the feed rate of HBr gas is at least as great as the feed rate of Cl$_2$ gas, while the feed rate of Cl$_2$ gas plus the feed rate of HBr gas is at least 10 standard cubic centimeters per minute (sccm) but is no greater than 300 sccm.

Any native oxide film that may form on the wafer due to its exposure to the atmosphere as it is transferred from the plasma etching system to the reactive ion etching system may be readily removed in the reactive ion etching system by etching it for 10 seconds in $CF_4$ gas at a gas feed rate of 10 sccm.

Figure 3F:
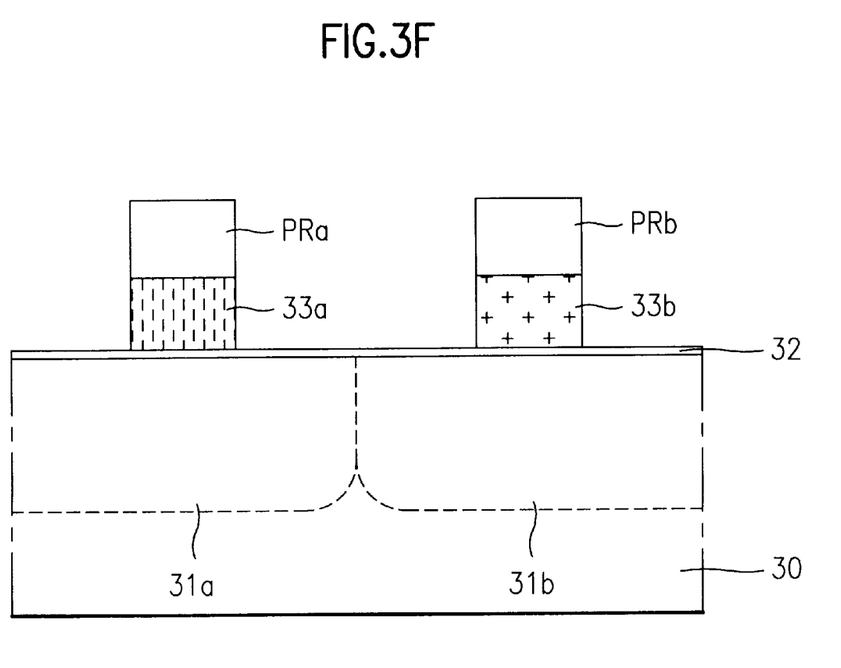

Still masked by the photoresist patterns PRa and PRb, the etched, doped polysilicon layer 33c is then selectively dry-etched in a reactive ion etching system, initially in a mixture of $Cl_2$ and HBr gases and subsequently in a mixture of $Cl_2$, HBr, He, and $O_2$ gases, in order to form pairs of adjacent p-type polysilicon gate electrodes 33b and n-type polysilicon gate electrodes 33a that lie over the pairs of adjacent n-wells 31b and p-wells 31a, respectively, as shown in FIG. 3F. The initial $Cl_2$ and HBr gas feed rates are adjusted so that the initial feed rate of HBr gas is at least as great as the initial feed rate of $Cl_2$ gas, while the initial feed rate of $Cl_2$ gas plus the initial feed rate of HBr gas is at least 10 sccm but is no greater than 300 sccm.

The subsequent $Cl_2$ and HBr gas feed rates in the reactive ion etching system are adjusted so that the subsequent feed rate of HBr gas is at least twice as great as the subsequent feed rate of $Cl_2$ gas, while the subsequent feed rate of $Cl_2$ gas plus the subsequent feed rate of HBr gas is at least 10 sccm but is no greater than 200 sccm. The subsequent He and $O_2$ feed gas rates in the reactive ion etching system are adjusted so that the feed rate of He gas plus the feed rate of $O_2$ gas is at least 4 sccm.

The method of the present invention sequentially employs plasma and reactive ion etching process steps to form the polysilicon gate electrodes of a twin-well CMOS device, thereby utilizing the advantages of each dry-etching technique to overcome the shortcomings of prior art methods that employ either one of the techniques alone. Since 50–80% of the initial thickness of the doped polysilicon layer 33d is anisotropically dry-etched by means of an anisotropic plasma etching process, the gate-precursor features are formed quickly and with substantially vertical sidewalls. Since the remaining 50–20% of the initial thickness of the doped polysilicon layer is etched by means of a reactive ion etching process, over-etching the thin insulating film to either side of each of the gate electrodes can be easily avoided.

The embodiments described above are intended to illustrate the claimed invention, but not to exhaustively delineate every detail of the invention as practiced. It will be apparent to those of ordinary skill in the art of CMOS device fabrication that various modifications and variations of the method of the present invention may be made without departing from either the spirit or the scope of the invention. The present invention is thus intended to cover such modifications and variations provided they fall within the scope of the appended claims and their equivalents.

What is claimed is:

1. A method of fabricating on a semiconductor substrate gate electrodes of a twin-well CMOS device, the method comprising the steps of:

forming within the substrate an n-well and a p-well adjacent to the n-well;

forming on the substrate an insulating film;

depositing onto the insulating film an undoped polysilicon layer, the undoped polysilicon layer having a first region over the n-well and a second region, adjacent to the first region, over the p-well;

selectively implanting p-type dopants into the first region and n-type dopants into the second region, thereby forming doped first and second polysilicon regions in the undoped polysilicon layer;

selectively and anisotropically etching, by plasma etching, upper portions of the doped first and second polysilicon regions, thereby forming first and second gate-precursor features, respectively, on the insulating film, each gate-precursor feature having substantially vertical sidewalls; and selectively etching, by using reactive ion etching, remaining portions of the doped first and second polysilicon regions having the first and second gate-precursor features until regions of the insulating film are exposed to either side of each of the gate-precursor features, thereby fabricating the gate electrodes of the twin-well CMOS device, wherein etch gases of said reactive ion etching include HBr gas and $Cl_2$ gas, wherein an initial feed rate of said HBr gas is greater than an initial feed rate of said $Cl_2$ gas, and wherein etch rates of each of the etch gases are changed from initial feed rates to subsequent feed rates.

2. The method according to claim 1, wherein a mixture of etch gases used for the plasma etching consists essentially of $Cl_2$ gas and HBr gas.

3. The method according to claim 2, wherein the feed rate of HBr gas of the mixture of etch gases of the plasma etching system is at least as great as the feed rate of $Cl_2$ gas of the mixture of etch gases of the plasma etching system.

4. The method according to claim 3, wherein the feed rate of $Cl_2$ gas of the mixture of etch gases of the plasma etching system plus the feed rate of HBr gas of the mixture of etch gases of the plasma etching system is at least 10 sccm but is no greater than 300 sccm.

5. The method according to claim 1, wherein the step of selectively etching the remaining portions of the doped first and second polysilicon regions includes a sub-step of:

changing the mixture of the etch gases of the reactive ion etching system from an initial mixture to a subsequent mixture.

6. The method according to claim 4, wherein the initial mixture of the etch gases of the reactive ion etching consists essentially of $Cl_2$ gas and HBr gas.

7. The method according to claim 6, wherein the initial feed rate of $Cl_2$ gas of the initial mixture of the etch gases of the reactive ion etching plus the initial feed rate of HBr rate of HBr gas of the initial mixture of the etch gases of the reactive ion etching is at least 50 sccm but is no greater than 300 sccm.

8. The method according to claim 4, wherein a subsequent mixture of the etch gases of the reactive ion etching consists essentially of $Cl_2$ gas, HBr gas, He gas, and $O_2$ gas.

9. The method according to claim 7, wherein the subsequent feed rate of $Cl_2$ gas of the subsequent mixture of the etch gases of the reactive ion etching plus the subsequent feed rate of HBr gas of the subsequent mixture of the etch gases of the reactive ion etching is at least 10 sccm but is no greater than 200 sccm.

10. The method according to claim 9, wherein the subsequent feed rate of He gas of the subsequent mixture of the etch gases of the reactive ion etching system plus the subsequent feed rate of $O_2$ gas of the subsequent mixture of the etch gases of the reactive ion etching system is at least 4 sccm.

11. The method according to claim 1, wherein a subsequent feed rate of said HBr gas is at least twice as great as a subsequent feed rate of said $Cl_2$ gas.

12. The method according to claim 1, wherein said reactive ion etching includes a cleanup phase, before introduction of said HBr gas and said $Cl_2$ gas, wherein native oxide formed during a transition from said plasma etching to said reactive ion etching is removed using $CF_4$ gas.

13. A method of fabricating gate electrodes of a semiconductor device, the method comprising:

forming an n-well and a p-well within a substrate;

forming an insulating film on the substrate;

forming an undoped polysilicon layer on the insulating film over the n-well and p-well;

selectively implanting p-type and n-type dopants into certain portions of the undoped polysilicon layer to form first and second doped polysilicon patterns;

removing upper portions of the first and second doped polysilicon patterns using plasma etching; and removing portions of the remaining portions of the first and second doped polysilicon patterns using reactive ion etching to fabricate the gate electrodes of the semiconductor device, wherein etch gases of said reacting ion etching include HBr gas and $Cl_2$ gas, wherein an initial feed rate of said HBr gas is greater than an initial feed rate of said $Cl_2$ gas and wherein said initial feed rates of said HBr gas and said $Cl_2$ are changed to subsequent feed rates, respectively.

14. The method according to claim 13, wherein in the first removing step, an upper 50–80% of the first and second doped polysilicon patterns is selectively etched by the plasma etching system.

15. The method according to claim 14, wherein in the second removing step, the remaining 50–20% of the first and second doped polysilicon patterns is selectively etched by the reactive ion etching system.

16. The method according to claim 15, wherein in the first removing step, $Cl_2$ and HBr gases are used in the plasma etching system to etch the first and second doped polysilicon patterns.

17. The method according to claim 13, wherein a subsequent feed rate of said HBr gas is at least twice as great as a subsequent feed rate of said $Cl_2$ gas.

18. The method according to claim 13, wherein said reactive ion etching includes a cleanup phase, before introduction of said HBr gas and said $Cl_2$ gas, wherein native oxide formed during a transition from said plasma etching to said reactive ion etching is removed using $CF_4$ gas.

* * * * *